United States Patent [19]

Pelgrom et al.

[11] Patent Number: 4,774,719
[45] Date of Patent: Sep. 27, 1988

[54] CHARGE-COUPLED DEVICE WITH DIODE CUT-OFF INPUT

[75] Inventors: Marcellinus J. M. Pelgrom; Hendrik Heijns, both of Eindhoven, Netherlands

[73] Assignee: U.S. Philips Corporation, New York, N.Y.

[21] Appl. No.: 33,129

[22] Filed: Mar. 31, 1987

[30] Foreign Application Priority Data

Apr. 9, 1986 [NL] Netherlands ............... 8600891

[51] Int. Cl.[4] ............... G11C 19/28; H01L 29/78
[52] U.S. Cl. ............................... 377/60; 357/24
[58] Field of Search ............... 357/24; 377/57-63

[56] References Cited

U.S. PATENT DOCUMENTS 3,925,805 12/1975 Erb ........................... 357/24

OTHER PUBLICATIONS

Wallinga "A Comparison of CCD Analog Input Circuit Characteristics", Int. Conf. Technology and Applications of Charge Coupled Devices, Edinburgh (9/74), pp. 13–21.
Beynon et al., Eds. *Charge-Coupled Devices and Their Applications*, McGraw-Hill, London (1980), pp. 187–189.

Primary Examiner—Gene M. Munson
Attorney, Agent, or Firm—Steven R. Biren

[57] ABSTRACT

The invention relates to a CCD having a diode cut-off input, a reference voltage being applied to the input diode and the input signal being supplied to an input gate located in front of the first clock electrode. If the electrodes are composed of a transfer part and a storage part with an incorporated potential difference, it is possible that incomplete charge transport may occur from the input to the first clock electrode. In order to avoid this incomplete charge transport and/or to be able to enlarge the dynamic range of the input signal, a larger clock voltage, for example 10 V, is applied to the first clock electrode than to the following clock electrodes, which receive, for example, 5 V. In a preferred embodiment, the 5 V clock voltage can be supplied for this purpose by a boots-trap circuit ot the first clock electrode.

5 Claims, 2 Drawing Sheets

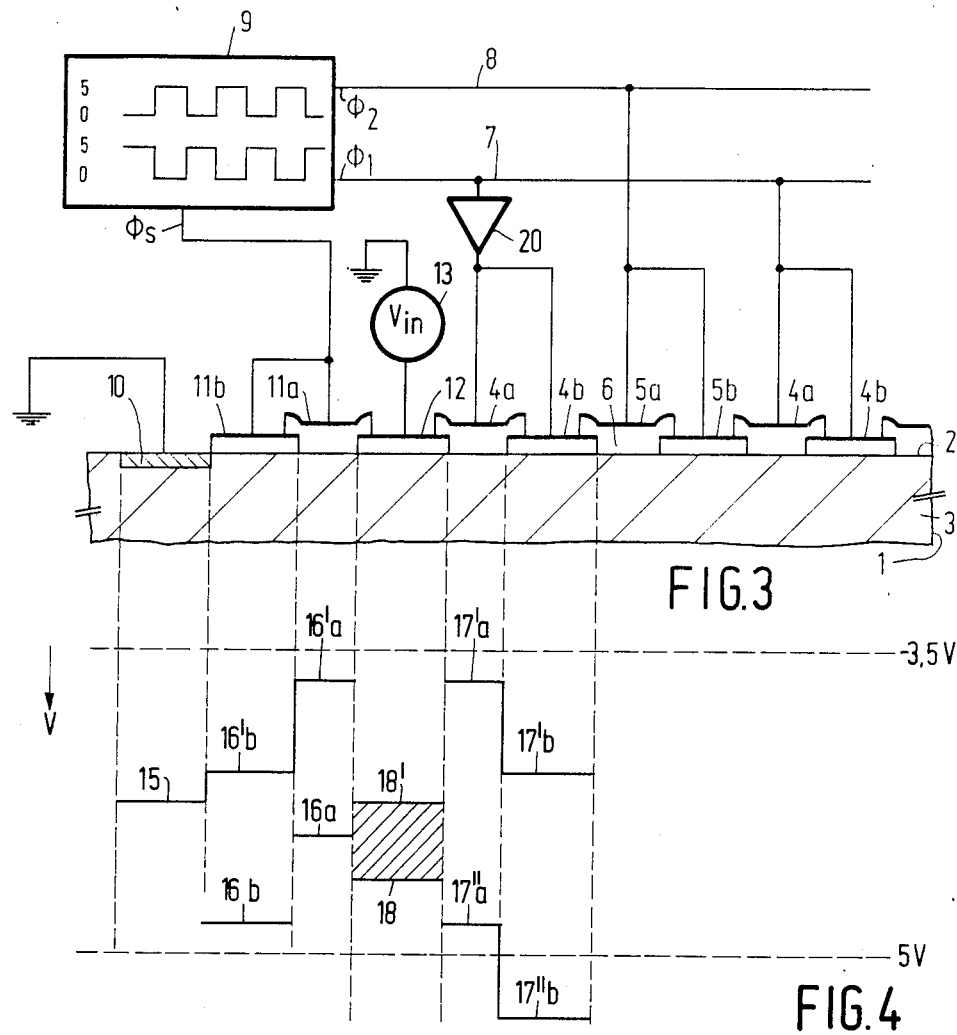
FIG.3
FIG.4
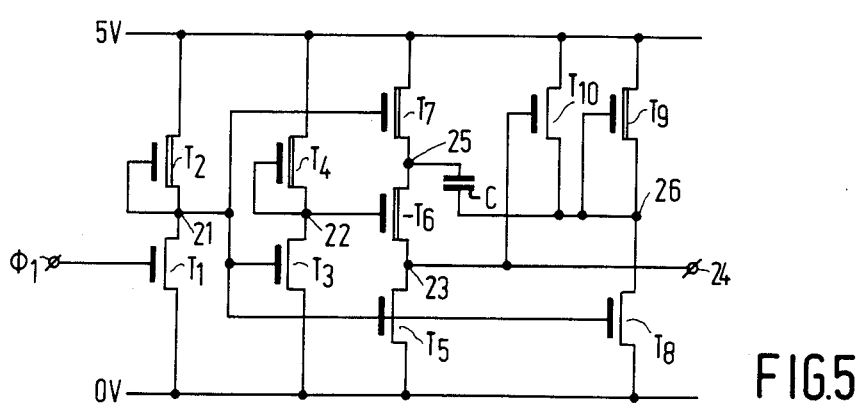
FIG.5

CHARGE-COUPLED DEVICE WITH DIODE CUT-OFF INPUT

BACKGROUND OF THE INVENTION

The invention relates to a semiconductor device comprising a charge-coupled device provided at a surface of a semiconductor body and comprising an input stage for forming charge packets in dependence upon an input signal, and a row of clock electrodes provided with connection means for applying clock voltages on behalf of the sequential storage and transport of these charge packets in an underlying charge transport channel, the input stage comprising, viewed in the charge transport direction, in order of succession an input diode, a first electrode (designated hereinafter as sample gate) and a second electrode (designated hereinafter as input gate), while the input diode is provided with a connection for applying a fixed voltage, the input gate is provided with means for applying the input signal and the sample gate is provided with means for applying a sample clock voltage for closing and interrupting the connection between the input diode and the region below the input gate.

A charge-coupled device comprising such an input stage designated as SHC2 (sample and hold circuit 2) is described in the article "A Comparison of CCD Analog Input Circuit Characteristics" by H. Wallings, International Conference on Technology and Applications of Charge-Coupled Devices, Edinburgh, September 1974, p. 13–21. This input has a linear characteristic and is moreover suitable for applications at high frequencies. In this publication the disadvantage is mentioned that the input signal should be supplied or should be attenuated in pulsatory form in order to guarantee that the charge packet below the input gate can be transferred as a whole to the storage zone below the first clock electrode. However, the aforementioned solutions also have disadvantages. For example, when the input signal is supplied in pulsatory form, this may lead to signal distortion, which may be unobjectionable for digital applications, it is true, but may be ojectionable, for example, for analog voltages. Attenuation of the signal generally leads to a disadvantageous reduction of the signal-to-noise ratio. For further background, see "IEEE Journal of S.S.C.", Vol. SC-13, No. 5, pp. 542–548 (October 1978).

The problem of incomplete charge transport from the input structure to the charge transport channel with the use of input circuits of the kind described above occurs especially in charge-coupled devices, in which the electrodes comprise a transfer part and a storage part and in which means (thicker oxide and/or, for example, additional implantation) are internally provided for inducing a potential barrier below the transfer parts. As will appear from the description of the Figures, due to this potential barrier, the range in which the input signal can vary is very small as a result of the requirement that it must be possible for the whole charge packet to be transferred.

SUMMARY OF THE INVENTION

The invention has inter alia for its object to provide a semiconductor device of the kind described above, in which the input signal can vary without distortion within a comparatively large voltage range, for example within 2 V at a clock voltage of 5 V.

According to the invention, a semiconductor device of the kind described above is characterized in that the conection means comprise an amplifier, whose output is connected to the first clock electrode following the input gate and to whose input the clock voltage fitting in the row of clock electrodes can be applied, as a result of which upon application of this clock voltage a potential well can be induced below the first clock electrode, which well is sufficiently deep to cause the whole charge packet formed below the input gate to flow into this potential well.

Due to the fact that instead of the usual clock voltage a larger clock voltage is applied to the first clock electrode, it is ensured that during the charge transport the level of the potential barrier below the transfer part of the first clock electrode is lower than the lowest potential level below the input gate. Due to the fact that the amplified clock voltage is applied only to the first clock electrode and not to the remaining clock electrodes, the dissipation in the device will substantially not increase. An important preferred embodiment, which renders it possible to operate the device with the usual low supply voltage (for example 5 V), is characterized in that the amplifier comprises a bootstrapped driver circuit.

BRIEF DESCRIPTION OF THE DRAWINGS

The invention will be described more fully with reference to an embodiment and the accompanying diagrammatic drawing, in which:

FIG. 3 shows an embodiment of a semiconductor device according to the invention;

FIG. 4 shows a diagram of the potential distribution during operation in this device; and FIG. 5 shows the circuit diagram of a driver circuit used in the device shown in FIG. 3.

DESCRIPTION OF THE PREFERRED EMBODIMENT

Figures 1, 2:
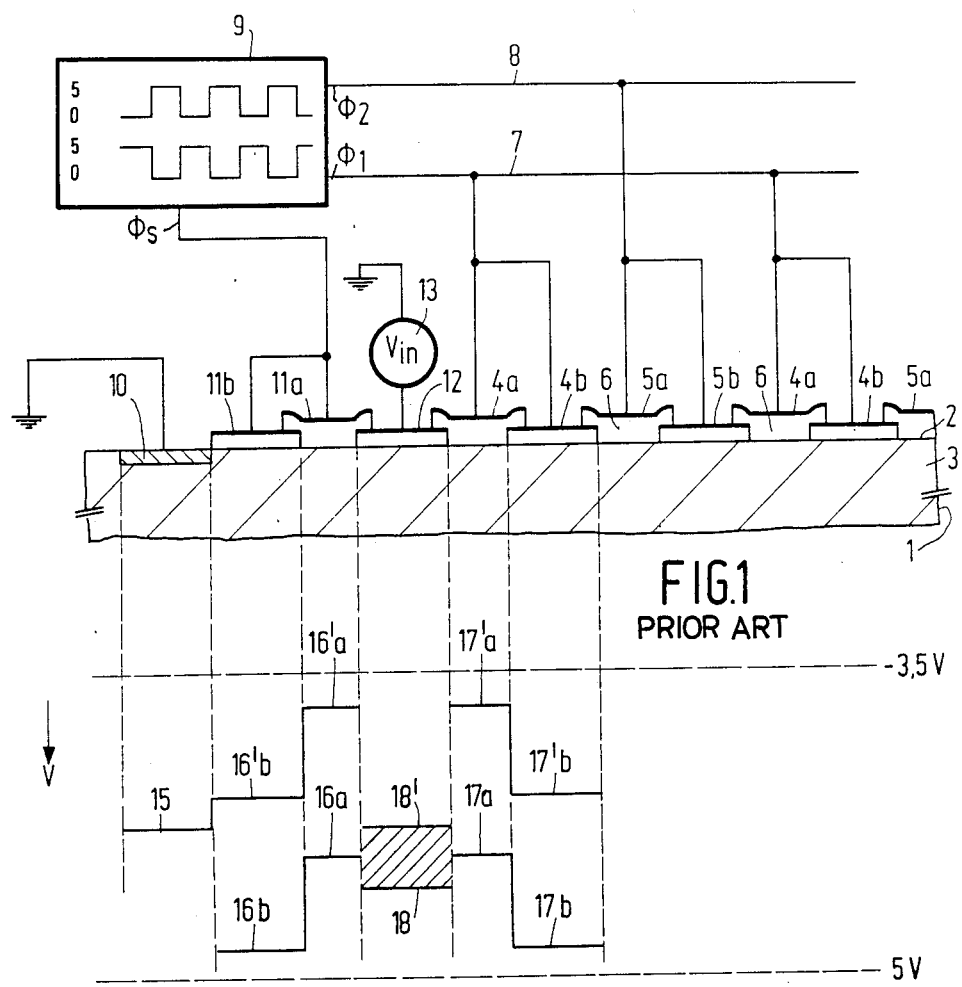
FIG. 1 is a sectional view of a charge-coupled device of the kind described in the opening paragraph, in which a conventional clock voltage is applied to the first clock electrode.
FIG. 2 shows a diagram of the potential distribution in this device during operation.

The invention will be described with reference to a surface channel CCD. Although the invention in itself may also be used in charge-coupled devices having a buried channel (BCCD) for certain applications, for example those in which stringent requirements are imposed on the linearity, charge-coupled devices having a surface channel or BCCD's having an input structure in surface channel technology are often preferred.

For explanation of the problem to be solved by the invention, FIG. 1 shows a charge-coupled device of the kind described above, which is controlled with the usual clock voltages. The device, which in this case is of the n-channel type, but may of course also be of the p-channel type, comprises a p-type semiconductor body 1 of, for example, silicon, at whose surface 2 the channel 3 is located. For controlling the charge transport through the channel 3, the surface 2 is provided with a row of clock electrodes 4,5, which are separated by an intermediate oxide layer 6 from the surface. The clock electrodes each comprise a transfer part a and a storage part b, which parts are distinguished from each other by means which are present to induce upon application of a clock voltage below the transfer part a a potential barrier and below the storage part a potential well in the channel 3. In the present embodiment, these means are constituted by the thicker oxide 6 below the transfer parts 4a, 5a and the thinner oxide below the storage parts 4b, 5b. Of course these means may also comprise other known means for varying the threshold voltage, such as, for example, regions implanted in the channel. In the example to be described here, the electrode configuration with transfer part and storage part is used for the two-phase mode of operation.

However, in other embodiments, this electrode configuration serves to operate the device as a one-bit-per-electrode device, in which all the storage sites but one are filled with information and the vacancy is displaced in the direction opposite to the charge transport direction. Moreover, other electrode configurations, such as one- or three-layer configurations, may also be used.

The clock electrodes 4,5 are connected in known manner via clock lines 7 and 8, respectively, to a clock voltage source 9, which supplies the clock voltages $\phi_1, \phi_2$ indicated diagrammatically in the block 9.

The input of the charge-coupled device comprises, viewed in the charge transport direction (from the left to the right), in order of succession: an n+ source zone 10 (designated hereinafter as input diode), which supplies electrons for forming the charge packets; a first electrode 11, which constitutes a sample gate, and a second electrode 12, which constitutes the input gate.

The input diode 10 is connected to a fixed potential, for example ground. The input gate 12 is connected to a voltage source 13, which comprises a signal source and which supplies a signal-dependent voltage to the input electrode 11 determining the size of the charge packet to be formed below the input electrode 12. The sample electrode 11, which is composed for reasons of manufacturing technology in the same manner as the clock electrodes 4,5 of a part 11a on thicker oxide and a part 11b on thinner oxide, serves as a switch between the input diode 10 and the storage region below the input electrode 12. A sample clock $\phi_s$ is applied to the sample gate 11, which clock is supplied by the source 9.

During operation, the body 1 is connected to a reference voltage of, for example, $-3.5$ V, while clock voltages $\phi_1, \phi_2$ having levels of 0 and 5 V are applied to the clock electrodes 4,5. The clock $\phi_s$ also varies between 0 and 5 V. FIG. 2 shows the potential distribution occurring at these voltages in a part of the device, the quantity V representing the surface potential which is plotted in downward direction, as is usual for CCD's. In the Figure, the potential levels of the substrate voltage and 5 V are also indicated by broken lines. The level 15 represents the potential level of the input diode 10. The surface potential below the sample gate 11 is indicated by reference numeral 16, the surface a and b designating the potentials below the parts 11a and 11b, respectively. The potential $16'a, 16'b$ occurs at a clock voltage $\phi_s = 0$ V. The potential 16a, 16b occurs at a clock voltage $\phi_s = 5$ V. As appears from the diagram, electrons can flow from the input diode 10 to the region below the input gate 12 at $\phi_s = 5$ V, while the flow of electrons is blocked at $\phi_s = 0$ V. In an analogous manner, the levels 17a,b, 17'a,b represent the potentials below the first clock electrode 4a,4b at $\phi_1 = 5$ V and $\phi_1 = 0$ V, respectively. The potential difference, for example, between the levels 17'a and 17'b determinative of the maximum quantity of charge per charge packet is about 3 V. The highest possible surface potential level 18 (in the Figure the lowest level) below the input gate 12 corresponding to $V_{in}$ maximum is determined by the potential level 15 of the input diode 10. The lowest effective potential level 18 below the input gate 12 corresponding to the highest input signal $V_{in}$ is determined by the height of the potential barrier 17a. If, as shown in FIG. 2, $V_{in}$ exceeds this maximum value, the level 18 will fall below the potential level 17a. In this situation, it will no longer be possible to transfer the whole quantity of charge stored below the input gate 12 to the potential well 17b below the first clock electrode 4.

In practical embodiments, it has been found that the potential difference between the levels 18 and 17 is so small, i.e. smaller than 1 V, that inter alia due to fluctuations in the threshold voltage at a maximum input voltage $V_{in}$ the potential level 12 often lies below the level 17a so that it is not possible to transfer the whole charge packet.

FIG. 3 shows an embodiment of a semiconductor device, in which the problem described above is avoided in a simple manner. For the sake of simplicity, the device is provided for identical parts with the same reference numerals as the device shown in FIG. 1. In contrast with the device shown in FIG. 1, the first clock electrode 4 is now connected, not directly, but through the amplifier 20, to the clock line 7. Preferably, a bootstrap circuit is used for this amplifier so that the supply voltage of 5 V need not be modified. FIG. 5 shows by way of example the circuit diagram of such a circuit. It should be noted that in the circuit diagram transistors of the depletion type are indicated by a double line in the channel region, while transistors of the enhancement type are indicated therein by a single line. The clock signal $\phi_1$ supplied by the clock voltage source 9 is supplied to the gate of the transistor $T_1$, while the amplified output signal $\phi_0$ is derived from the drain of the transistor $T_5$. The circuit comprises two supply lines of 0 V and 5 V. From the lefthand side, the circuit comprises in the first place a first inverter stage comprising the series-combination of a driver transistor $T_1$ and a load transistor $T_2$. The first inverter stage is followed by a second similar inverter stage comprising the driver transistor $T_3$ and the load transistor $T_4$. The input of this second inverter stage, i.e. the gate of $T_3$, is connected to the input 21 of the first inverter stage. The gates of the load transistors $T_2$ and $T_4$ are connected to their source zones. The inverter stage $T_3, T_4$ is followed by a series-combination of three transistors, i.e. $T_5$, $T_6$ and $T_7$. The gate electrodes of the transistors $T_5$ and $T_7$ are connected to the output 21 of the first inverter stage. The gate of $T_6$ is connected to the output 22 of the second inverter stage $T_3, T_4$. The junction point 23 of $T_5$ and $T_6$ is connected to the output terminal 24, at which the output signal can be derived, which can be applied to the first clock electrode 4. The junction point 25 between the transistors $T_6$ and $T_7$ is connected to one side of the bootstrap capacitance C. On the righthand side of the drawing, a series-combination is shown of two transistors, i.e. the transistor $T_8$, whose gate is connected to the output 21 of the first inverter stage, and the depletion transistor $T_9$, whose gate is connected to the source zone 26. The transistor $T_{10}$ is connected in parallel with to $T_9$ and its gate is connected the output 24, i.e. the junction point 23. The junction point 26 between $T_8$ and $T_9$ is connected to the second side of the bootstrap capacitance C.

For an explanation of the operation of the circuit, assume the situation in which $\phi_1 = 0$ V (low). $T_1$ is non-conducting; the point 21 then reaches 5 V (high). This signal is inverted again by the inverter stage $T_3, T_4$ so that the junction point 22 becomes low (nearly 0 V). In this situation, the transistors $T_5$ and $T_7$ are conducting and the transistor $T_6$ is non-conducting. The junction point 23 (also consituting the output) is applied to 0 V and the junction point 25 is applied to 5 V. At the same time, because $T_8$ is conducting and $T_{10}$ is non-conducting, the junction point 26 is applied to (nearly) 0 V. If now $\phi_1$ goes to 5 V (high), the junction points 21 and 22 go to 0 V and 5 V, respectively. The transistors $T_5$ and $T_7$ are then non-conducting and $T_6$ becomes conducting. At the same time, $T_8$ becomes non-conducting, as a result of which the voltage at the junction point 26 increases to 5 V. Due to the fact that the bootstrap capacitance C is connected to the junction point 26 and the transistors $T_5$ and $T_7$ are non-conducting, the voltage at the junction point 25 which was already applied to 5 V, to a value of practically 10 V. Due to capacitive voltage divisions, the ultimate potential value at the point 25 may be slightly lower than 10 V. Since in this situation the transistor $T_6$ is conducting, the junction point 23 and hence the output 24 follows the voltage source of the junction point 25 to nearly 10 V. The transistor $T_{10}$, which in this situation is also conducting, only serves to increase the speed at which the junction point 26 is charged.

By the use of the bootstrap driver circuit shown in FIG. 5, it is possible to obtain, while using 5 V clock voltages $\phi_1,\phi_2$, a transfer of the whole charge packet below the input gate to the first clock electrode 4, as is shown in FIG. 4. In this Figure, for corresponding potential levels the same reference numerals as in FIG. 2 are used. The difference between FIG. 4 and FIG. 2 mainly resides in the fact that at $\phi_1=5$ V the potential level 17"a, 17"b lies now a few volts lower than the level 17a, 17b in FIG. 2. As a result, if $V_{in}$ is a maximum, the level 18 will lie above the potential level 17"a so that the whole quantity of charge stored at this value of $V_{in}$ below the input gate 12 can flow to the charge transport channel 3. The signal distortion described earlier that may occur in conventional devices due to incomplete charge transport is avoided in a simple manner in the device described according to the invention without it being necessary to reduce the input signal $V_{in}$. Moreover, in the device described here, the remaining clock electrodes can be driven by means of conventional low clock voltage $\phi_1,\phi_2$ of 0 and 5 V so that the dissipation substantially does not increase.

It will be appreciated that the invention is not limited to the embodiment shown, but that many variations are possible for those skilled in the art without departing from the scope of the invention. For example, the invention may be used not only in charge-coupled devices with incorporated potential barriers, but also in devices in which this barrier is not present, such as, for example, in the four-phase device described in the aforementioned publication.

What is claimed is:

1. A semiconductor device having a semiconductor body and comprising a charge-coupled device provided at a surface of said semiconductor body and comprising an input stage for forming charge packets in response to an input signal, and a row of clock electrodes provided with connection means for applying clock voltages for the sequential storage and transport of these charge packets in an underlying charge transport channel, the input stage comprising, viewed successively in the direction of charge transport, an input diode, a first electrode forming a sample gate and a second electrode forming an input gate, said input diode being provided with a connection for applying a fixed voltage, the input gate being provided with means for applying the input signal, and the sample gate being provided with means for applying a sample clock voltage for opening and closing the connection between the input diode and the region below the input gate, said means for applying the sample clock voltage comprising an amplifier whose output is connected to the first clock electrode following the input gate whose input is connected to the sample clock voltage, whereby upon application of said sample clock voltage a potential well can be induced below the first clock electrode having a sufficient depth to cause the whole charge packet formed below the input gate to flow into this potential well.

2. A semiconductor device as claimed in claim 1, characterized in that each clock electrode comprises a transfer part and a storage part, and upon application of a clock voltage a potential barrier is induced below the transfer part and a potential well is induced below the storage part.

3. A semiconductor device as claimed in claim 2, characterized in that the device comprises a two-phase charge-coupled device.

4. A semiconductor device as claimed in claim 1, 2 or 3, characterized in that the device is a charge-coupled device of the surface channel type.

5. A semiconductor device as claimed in claim 1, 2 or 3, characterized in that said amplifier comprises a bootstrapped driver circuit.

* * * * *